Aug. 5, 1969 W. B. HARRIS 3,459,972

THYRISTOR SWITCH PULSE GENERATING CIRCUIT HAVING MEANS TO IMPROVE SHAPE OF OUTPUT PULSE

Filed April 10, 1967

INVENTOR
W. B. HARRIS
BY B. E. Stoddard
ATTORNEY

United States Patent Office 3,459,972
Patented Aug. 5, 1969

3,459,972
THYRISTOR SWITCH PULSE GENERATING CIRCUIT HAVING MEANS TO IMPROVE SHAPE OF OUTPUT PULSE

William B. Harris, Bernardsville, N.J., assignor to Bell Telephone Laboratories, Incorporated, Murray Hill and Berkeley Heights, N.J., a corporation of New York
Filed Apr. 10, 1967, Ser. No. 629,711
Int. Cl. H03k 3/26
U.S. Cl. 307—284 10 Claims

ABSTRACT OF THE DISCLOSURE

The step voltage that appears at the top of a rectangular pulse produced by a switch circuit employing a single thyristor can be materially reduced by connecting a circuit comprising a resistor in parallel with a diode between the grounded cathode of the thyristor and the turn-off circuit.

BACKGROUND OF THE INVENTION

This invention relates to improved semiconductor switch circuits capable of operating at high speeds in high power circuits for producing rectangular pulses hav- variable widths and fast fall times.

Semiconductor switches of the prior art have used a variety of semiconductor devices. The semiconductor devices most commonly used in switch circuits are four-layer PNPN devices known as silicon controlled rectifiers or thyristors. As is well known, a PNPN device is usually provided with three terminals and has properties somewhat analogous to a gas-filled thyratron and, like the thyratron, once it is switched on, it remains conductive until a turn-off mechanism is operated. Although the operating speed of the thyristor is inherently much greater that that of the thyratron, some utilization circuits require faster operating speeds than those for which a thyristor is inherently capable.

The need for faster operating speeds has been met by a prior art thyristor switch circuit which is disclosed and claimed in a copending patent application filed by Messrs. W. B. Harris, R. P. Massey, and F. J. Zgebura. This prior application, bearing Ser. No. 537,544, was filed on Mar. 25, 1966, now Patent No. 3,404,293, and is assigned to the same assignee as the present application. The circuit of this copending application is described in detail hereinafter with reference to FIG. 1 of the drawing.

Although this prior art circuit has made it possible to reduce the turn-off time of the thyristor switch to one-half or less of its inherent turn-off time, it is not fully satisfactory for all purposes. The reason for this is that a pulse produced by this switch circuit does not have a precisely flat top but, instead, has a step formation that is caused by a voltage drop produced by certain circuit components. Accordingly, it is an object of this invention to improve the wave shape of a pulse by reducing or minimizing any variation in output voltage during the width of the pulse.

SUMMARY OF THE INVENTION

The invention comprises a thyristor switch circuit having a conventional reverse current turn-off circuit and an impedance between the gate and cathode of the thyristor to reduce false triggering from the rate effect. Both the rate effect and the turn-off capabilities are improved by connecting a diode between the gate and cathode of the thyristor, and another diode between the thyristor gate and anode of the thyristor. These diodes are so constructed that the reverse recovery time of the middle junction in the thyristor is less than that of the first diode and greater than that of the second diode. The wave shape of a pulse produced by this switch circuit is substantially improved by connecting a circuit comprising a resistor in parallel with a diode between the grounded cathode of the thyristor and the turn-off circuit. This functions to produce a pulse having an essentially flat top.

BRIEF DESCRIPTION OF THE DRAWING

The features of this invention are fully discussed hereinafter in relation to the following detailed description of the drawing in which.

DETAILED DESCRIPTION

Figure 1:
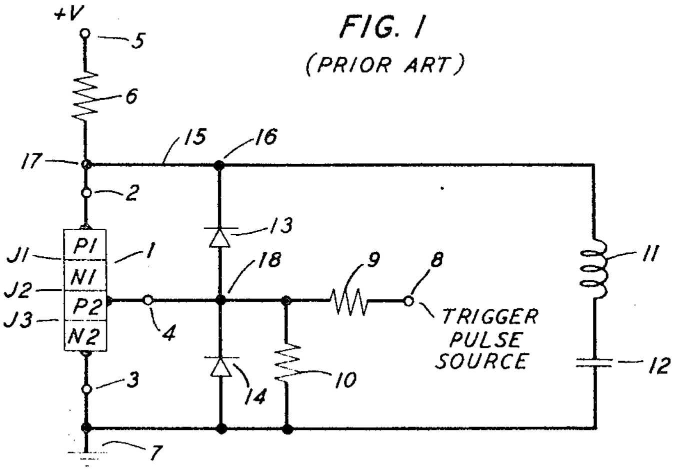
FIG. 1 (PRIOR ART)
FIG. 1 discloses the single thyristor switch circuit of the above-mentioned copending application.

The switch circuit of the above-mentioned copending patent application is represented in FIG. 1 as utilizing a single thyristor 1 comprising four layers having regions P1, N1, P2, and N2 with junctions J1, J2, and J3 between them. The thyristor 1 is provided with an anode terminal 2 connected to the upper outer layer P1, a cathode terminal 3 connected to the lower outer layer N2, and a gate terminal 4 connected to the lower intermediate layer P2. A supply source of direct voltage has its positive side connected to a terminal 5 and is coupled through a load resistor 6 to the anode terminal 2. The cathode terminal 3 is connected to a source of ground potential 7 which is understood to be connected to the negative side of the source of direct voltage.

The switch circuit further includes a source 8 of trigger pulse current which is coupled through a resistor 9 to the gate terminal 4 and through a resistor 10 to the cathode terminal 3. As is well known in the art, a positive trigger pulse from source 8 will cause current to flow through the divider resistors 9 and 10 thereby producing a potential difference between the gate terminal 4 and the cathode terminal 3. This functions to trigger the thyristor 1 by substantially reducing the impedance between the anode terminal 2 and the cathode terminal 3. The triggering of the thyristor 1 causes current to flow from the source 5 of positive direct voltage, through the load resistor 6, through the anode-cathode path in the thyristor 1 to the ground 7, and then back to the negative side of the direct voltage supply.

At this point, attention should be directed to a resonant turn-off circuit that comprises an inductor 11 and a capacitor 12 which are connected in series across the anode terminal 2 and the cathode terminal 3. Prior to the triggering of the thyristor 1, the capacitor 12 is charged to the same potential as that of the direct voltage source at terminal 5. When the thyristor is triggered, it becomes conductive and initiates the generation of a pulse across the load resistor 6. Also, at this time, a ringing current starts through inductor 11, thyristor 1, and capacitor 12. The first half cycle of this ringing current flows from the capacitor 12 through the inductor 11 and then in the forward direction through the thyristor 1.

At the beginning of the second half cycle, the ringing current reverses in phase and flows through the thyristor 1 in the reverse direction. This reverse ringing current quickly exceeds the normal load current thereby providing a net reverse current which flows from the cathode terminal 3, through all three of the junctions J1, J2, and J3, and then to the anode terminal 2.

In order to reduce the time required to restore the forward blocking capability of the thyristor 1 and also to improve its dynamic breakdown capability, two diodes 13 and 14 are connetced in series across the anode terminal 2 and the cathode terminal 3. It can be seen in FIG. 1 that this connection uses a lead 15 for connecting a point 16 between the inductor 11 and the upper diode 13 to a point 17 between the load resistor 6 and the anode terminal 2. The point 18 between the diodes 13 and 14 is joined to the conductor extending from the gate terminal 4 to the resistor 9 and the source 8 of trigger pulse current.

As is described in the above-mentioned copending application, the lower diode 14 has a reverse recovery time which is longer than the reverse recovery time of the middle junction J2 of the thyristor 1. Conversely, the upper diode 13 has a reverse recovery time which is less than the reverse recovery time of the junction J2. In other words, the reverse recovery time of the middle junction J2 is less than that of the lower diode 14 and is greater than that of the upper diode 13.

It should be noted that at the beginning of the second half cycle of the ringing current, the ringing current will be a reverse current for the two outer junctions J1 and J3 but will be a forward current for the middle junction J2. Therefore, the lower diode 14 will be momentarily reverse biased by the charge stored in the lower junction J3 while the upper diode 13 will be biased below its threshold voltage by the opposed charges in junctions J1 and J2. This condition of the diodes 13 and 14 permits the reverse ringing current to flow through the thyristor 1 at the start of the second half cycle.

However, the flow of reverse ringing current quickly functions to reduce the charge density in junction J3 to zero thereby causing it to recover and open. This does not terminate the pulse because the pulse current across the load resistor 6 is maintained by the flow of current through the diode 14. During the transition in junction J3, the current flow through the lower diode 14 will increase and will reach a point at which the diode 14 will be carrying all of the reverse current.

Since the reverse ringing current is also a reverse current for the upper junction J1, the junction J1 will partially recover during the time that the lower junction J3 is carrying reverse current. When this lower junction J3 fully recovers, the reverse current will flow through the lower diode 14, through the gate terminal 4 and into the middle junction J2, and then out through the upper junction J1. This forces the upper junction J1 to complete its recovery and reduces its charge density to zero. In other words, the upper junction J1 is forced to recover due to a forward current flowing through the middle junction J2 and increasing the hole storage effect in junction J2.

During this change in junction J1, the current flowing through junctions J1 and J2 will be reduced toward zero while the current flowing through the upper diode 13 will be correspondingly increased to the limit of the reverse ringing current. This flow of current through the upper diode 13 will cause an additional charge to be stored in the lower diode 14. It should be noted that, since the middle junction J2 had been forward biased, the existing charge density in this junction J2 is not zero and it begins to recover by recombination. The thyristor 1 is now open at both junctions J1 and J3 and further reverse current is unnecessary except to store more charge in the lower diode 14.

During the latter portion of the second half cycle of ringing current, a second forward current will be applied to the thyristor 1 due to the fact that the reverse recovary time of the upper diode 13 is less than the reverse recovery time of the middle junction J2. This current will flow in the forward direction through the upper junction J1 and in the reversed direction through the middle junction J2 and the lower diode 14. This forces junction J2 to recover while diode 14 completes its recovery by recombination.

By thus designing diode 14 to recover more slowly than the middle junction J2, gate triggering of the thyristor 1 is prevented as is explained in the abovementioned copending patent application. In addition, this provides a low impedance between the cathode terminal 3 and the gate terminal 4 for a short interval after the thyristor 1 recovers and thus improves the rate effect capability of this circuit.

As was stated above, the switch circuit of FIG. 1 has the advantage of possessing a fast operating speed for producing pulses. However, it is not fully satisfactory for all purposes because a pulse produced by this switch circuit does not have a precisely flat top but, instead, has a step formation that is caused by a voltage drop produced by the reverse diodes 13 and 14.

The manner in which this step formation is produced will now be described with reference to FIG. 2 wherein the middle broken line represents the magnitude of the positive voltage V from the direct current source 5.

The lower broken line indicates the magnitude of the voltage $V - V_t$ that occurs because of the reduction in voltage when the thyristor 1 becomes conductive. This is due to the fact that, when the thyristor 1 becomes conductive, it carries a current which is the sum of the load current through the resistor R and the first half cycle of the ringing current.

The upper broken line shows the voltage level $V + E_d$ wherein the voltage $E_d$ is caused by the positive voltage drop developed across the diodes 13 and 14 during the second half cycle of the ringing current. In other words, since the magnitude of the ringing current $I_{LC}$ is greater than the load current $I_L$ through the load resistor 6, then, when the ringing current reverses during its second half cycle, the load current $I_L$ will be subtracted from the ringing current $I_{LC}$ and the difference current $(I_{LC} - I_L)$ produces the voltage $E_d$. This voltage $E_d$ is added across the thyristor 1 to the voltage V from the source 5 thereby generating the voltage step indicated in FIG. 2 by the dotted line $V + E_d$.

Thus, due to this step formation, the thyristor 1 produces a variation in output during the width of a pulse. This is objectionable when the switch circuit is used in a system which depends for its effectiveness upon the stability of the output voltage during the width of a pulse.

Therefore, it is an object of the present invention to improve the wave shape of a pulse by reducing the abovementioned variation in output voltage during the width of the pulse. In other words, it is an object of this invention to provide an improved switch circuit with means for producing a pulse having a substantially flat top.

Figure 3:
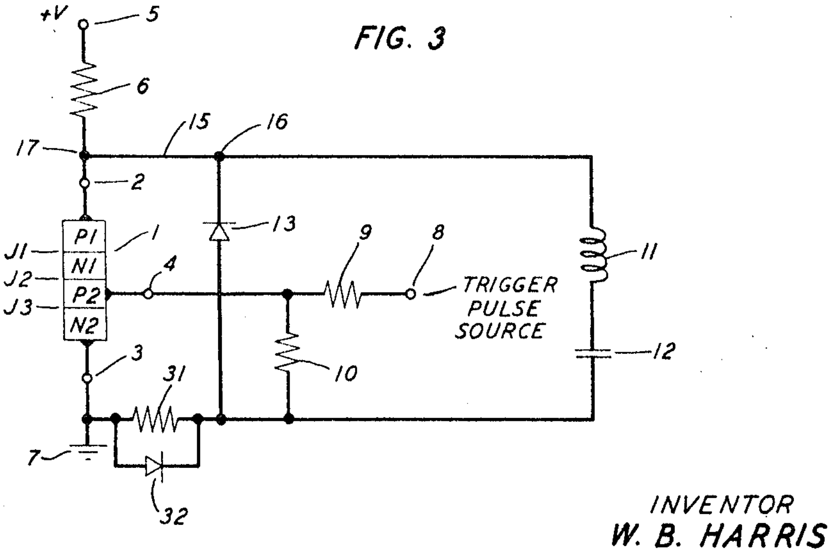
FIG. 3 shows the manner in which the thyristor switch circuit of FIG. 1 is modified so as to generate pulses having improved wave shapes.

This is accomplished by modifying the prior art switch circuit of FIG. 1 in the manner shown in FIG. 3. Since the thyristor switch circuit of FIG. 3 is a modification of the circuit shown in FIG. 1, those elements of FIG. 3 that are the same as those in FIG. 1 have been identified by applying to them the same reference designations.

When the circuit of FIG. 3 is compared with the circuit of FIG. 1, it can be seen that the circuit of FIG. 1 has been modified by omitting the point 18 and the diode 14, and by inserting a resistor 31 into the path extending from the anode of the diode 13 to the ground 7. In addition, a diode 32 is connected in parallel with the resistor 31 in such a manner that the diode 32 has its anode connected to the ground 7 and its cathode connected to the anode of the diode 13.

Thus, during the positive, or first, half cycle of the ringing current, the diode 32 provides a shunt path across the resistor 31 which, consequently, performs no useful function at this time. The shunting of the resistor 31 is necessary as otherwise the resistor 31 would, during this half cycle, produce a large voltage drop and would thereby function as a damping resistor for terminating the ringing current.

During the negative, or second, half cycle of the ringing current, the diode 32 blocks the reverse ringing current and forces it to flow through the resistor 31. Accordingly, the reverse ringing current is applied to the thyristor 1 and turns it off in the manner described above.

The turning off of the thyristor 1 forces the positive direct current from the source 5 to flow through the load resistor 6 to the point 17, along the lead 15 to the point 16, through the resonant circuit 11–12, and then through the resistor 31 to ground 7. This produces a voltage drop $RI_L$ across the resistor 31 and in a direction which is opposite to the direction of the voltage drop $E_d$ across the diode 13. By selecting an appropriate value for the resistor 31, the magnitude of its voltage drop $RI_L$ can be made to equal the voltage drop $E_d$. Since these equal voltage drops are of opposite polarity, they will cancel each other.

Figure 2:
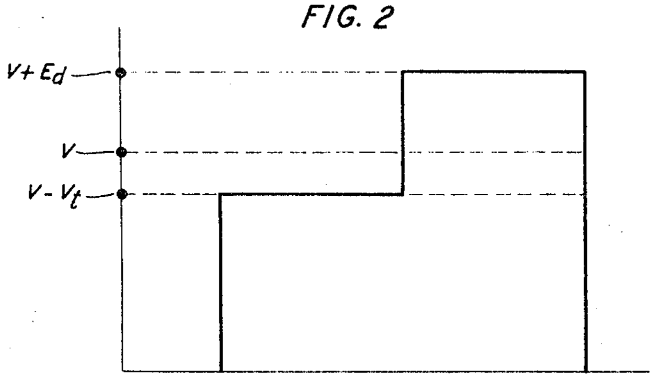
FIG. 2 is a chart illustrating voltage variations occurring during the width of a pulse generated by the switch circuit of FIG. 1.

By thus removing the component $E_d$ from the pulse output voltage, the top of the pulse is lowered from the line $V+E_d$ in FIG. 2 to the line V. Therefore, the wave shape of the pulse is improved and variations in its output voltage during the width of the pulse are minimized.

This method of improving the shape of a pulse can be applied to series strings of high voltage switch circuits by placing the resistor 31 in the switch circuit that is at the bottom of the string.

What is claimed is:

1. A switch circuit adapted for generating a pulse,
said switch circuit comprising a thyristor having at least anode, gate, and cathode terminals,
means for applying electric energy to said gate terminal for firing said thyristor,
a turn-off circuit adapted for turning off said thyristor,
at least one diode connected to said turn-off circuit for expediting the recovery by said thyristor of its forward-blocking capability,
said diode having the characteristic of producing a voltage drop,
said switch circuit being characterized in that it further comprises means for neutralizing the effect of said voltage drop,
said last-mentioned means including component means for producing a second voltage drop.

2. A switch circuit in accordance with claim 1 wherein said second voltage drop is of the same magnitude as said first-mentioned voltage drop but of opposite polarity,
and means for combining said voltage drops for effecting their mutual cancellation.

3. A switch circuit in accordance with claim 1 wherein said component means include a resistor,
and means for connecting said resistor between said turn-off circuit and one of said terminals of said thyristor.

4. A switch circuit in accordance with claim 3 and further comprising a diode connected in parallel with said resistor.

5. A switch circuit in accordance with claim 4 wherein said one thyristor terminal is said cathode terminal,
and wherein said diode has its anode connected to said cathode terminal and its cathode connected to said turn-off circuit.

6. A pulse switching circuit comprising a source of direct voltage,
a normally nonconductive pulse-forming thyristor having anode, cathode, and gate terminals,
said cathode terminal being connected to a point of ground potential,
a utilization circuit including a load resistor connected in series with said source and said anode and cathode terminals,
starting means for initiating the generation of a pulse across said load resistor,
said starting means including means for applying trigger energy to said gate terminal for firing said thyristor for rendering it conductive whereby a circuit path is closed from said source through said load resistor and said thyristor to said point of ground potential,
a turn-off circuit for producing electric energy for turning off said thyristor,
a first lead for connecting one end of said turn-off circuit to said anode terminal,
a second lead for connecting the other end of said turn-off circuit to a point between said cathode terminal and said point of ground potential,
said turn-off circuit including resonant means adapted for producing ringing current having a forward half cycle of current adapted for flowing over said first lead to said anode terminal, through said thyristor to said cathode terminal, and then back over said second lead to said resonant means,
said resonant means also having a reverse half cycle of current adapted for flowing over said second lead to said cathode terminal, through said thyristor to said anode terminal, and then back over said first lead to said resonant means,
means for expediting the recovery of the forward-blocking capability of said thyristor,
said means including a diode having its anode connected to said first lead and its cathode connected to said second lead,
said diode having the characteristic of producing a voltage drop which causes a variation in the output voltage of said pulse,
said pulse switching circuit being characterized in that it further comprises shaping means for improving the wave shape of said pulse,
said shaping means including component means for producing a second voltage drop having a polarity opposite to the polarity of said first-mentioned voltage drop,
both of said voltage drops being of the same magnitude,
and means for combining said voltage drops whereby one cancels the other.

7. A pulse switching circuit in accordance with claim 6 wherein said component means include a resistor connected in said second lead.

8. A pulse switching circuit in accordance with claim 7 and further comprising means for providing said forward ringing current with a shunt path across said resistor.

9. A pulse switching circuit in accordance with claim 8 and further comprising means for blocking the flow of said reverse ringing current through said shunt path.

10. A pulse switching circuit in accordance with claim 9 wherein said last-mentioned means include a diode having an anode and a cathode,
and means for connecting the anode of said diode to said cathode terminal of said thyristor and for connecting the cathode of said diode to said resonant means.

References Cited

UNITED STATES PATENTS

| | | | |
|---|---|---|---|
| 2,933,642 | 4/1960 | Marley | 307—228 XR |
| 3,079,514 | 2/1963 | Fischman | 307—284 XR |
| 3,346,745 | 10/1967 | Harris | 307—284 XR |

ARTHUR GAUSS, Primary Examiner

JOHN ZAZWORSKY, Assistant Examiner

U.S. Cl. X.R.

307—252, 268